(12) United States Patent
Tong et al.

(10) Patent No.: US 6,967,153 B2
(45) Date of Patent: Nov. 22, 2005

(54) BUMP FABRICATION PROCESS

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 223 days.

(21) Appl. No.: 10/248,688

(22) Filed: Feb. 10, 2003

(65) Prior Publication Data
US 2003/0166331 A1 Sep. 4, 2003

(30) Foreign Application Priority Data
Feb. 27, 2002 (TW) .................................. 91103533 A

(51) Int. Cl.$^7$ .................. H01L 21/44; H01L 21/48; H01L 21/50
(52) U.S. Cl. .................. 438/613; 438/611; 438/108
(58) Field of Search ................ 438/611, 612, 438/613, 614, 615, 108

(56) References Cited

U.S. PATENT DOCUMENTS 6,492,197 B1 * 12/2002 Rinne ................ 438/108
2002/0137325 A1 * 9/2002 Shao ................ 438/613

* cited by examiner

Primary Examiner—David Nelms
Assistant Examiner—Chuong Anh Luu
(74) Attorney, Agent, or Firm—Jiang Chyun IP office

(57) ABSTRACT

A bump fabrication process for forming a bump over a wafer having a plurality of bonding pads thereon is provided. A patterned solder mask layer having a plurality of openings that exposes the respective bonding pads is formed over a wafer. The area of the opening in a the cross-sectional area through a the bottom-section as well as through a the top-section of the opening is smaller than the area of the opening in a the cross-sectional area through a the mid-section of the opening. Solder material is deposited into the opening and then a reflow process is conducted fusing the solder material together to form a spherical bump inside the opening. Finally, the solder mask layer is removed. In addition, a pre-formed bump may form on the bonding pad of the wafer prior to forming the patterned solder mask layer over the wafer having at least with an opening that exposes the pre-formed bump. Solder material is deposited into the openings and then a reflow process is conducted fusing the solder material and the pre-formed bump together to form a spherical bump. The pre-formed bump and the solder material may be fabricated using different constituents.

27 Claims, 8 Drawing Sheets

BUMP FABRICATION PROCESS

CROSS REFERENCE TO RELATED APPLICATIONS

This application claims the priority benefit of Taiwanese application serial no. 91103533, filed on Feb. 27, 2002.

BACKGROUND OF INVENTION

1. Field of Invention

The present invention relates to a bump fabrication process. More particularly, the present invention relates to a bump fabrication process capable of producing a bump having a larger size and height.

2. Description of Related Art

In the fabrication of integrated circuit packages, a chip is linked to a carrier inside a first level package in one of three ways including wire bonding, tape automatic bonding (TAB) and flip chip (F/C). In a tape automatic bonding or a flip chip package, the process of linking up the chip and the carrier involves the production of bumps on the bonding pads of the chip. In fact, the bump serves as an electrical medium for connecting the chip and the carrier. A variety of types of bumps have been developed such as solder bumps, gold bumps, conductive polymer bumps and polymer bumps. However, solder bumps are the most popular type.

FIGS. 1A to 1F are schematic cross-sectional views showing the progression of steps for forming a conventional solder bump. As shown in FIG. 1A, a wafer 110 having an active surface 112 with a passivation layer 114 and a plurality of bonding pads 116 (only one is shown) is provided. The passivation layer 114 exposes the bonding pad 116 on the active surface 112 of the wafer 110. As shown in FIG. 1B, an under-ball-metallurgy (UBM) layer 120 is formed over the active surface 112 of the wafer 110 by carrying out one of the processes including evaporation, sputtering and electroplating. As shown in FIG. 1C, a relatively thick patterned photoresist photoresistant layer 130 is formed over the active surface 112 of the wafer 110. The patterned photoresist photoresistant layer 130 has a plurality of openings 132 (only one is shown) each one exposing a portion of the under-ball-metallurgy layer 120.

As shown in FIG. 1D, solder material 140 is deposited into the cavity space bounded by the sidewalls of the opening 132 and the under-ball-metallurgy layer 120 by carrying out one of the processes including evaporation, electroplating and printing. As shown in FIG. 1E, the thick photoresist photoresistant layer 130 is removed. Using the solder block 140 as a mask, a portion of the under-ball-metallurgy layer 120 outside the solder block 140 is removed so that only a portion of the under-ball-metallurgy layer 120 underneath the solder block 140 is retained. As shown in FIG. 1F, a reflow process is conducted so that the solder block 140 is transformed into a solder bump 142 having a spherical shape.

In order to increase height level of the solder bump 142, diameter of the opening 132 in the photoresist photoresistant layer 130 or thickness of the photoresist photoresistant layer 130 is often increased. Hence, more solder material 140 is able to accumulate inside the opening 132 and a solder bump 142 having a higher height level is ultimately produced after the reflow process. However, if the thickness of the photoresist photoresistant layer 130 is intended to be increased, it needs to precisely control the processes of exposure and development. In this situation, the process for fabricating the solder bump 142 is even more complicated, making completion of the processes not easy to perform.

SUMMARY OF INVENTION

Accordingly, one object of the present invention is to provide a bump fabrication process capable of producing a bump having a larger size and height level.

A second object of this invention is to provide a bump fabrication process that utilizes the amalgamation of a pre-formed solder bump and solder material to produce a bump having a larger size and height level and at the same time having the desired constituents. The desired constituents inside the bump after fusing the pre-formed solder bump and the solder material together is are obtained by adjusting the ratio of constituents inside the pre-formed solder bump and the solder material.

A third object of this invention is to provide a bump fabrication process capable of producing a bigger and higher bump by depositing solder material onto a bump already formed over a wafer and fusing the solder material with the original bump together in a reflow process thereafter. Furthermore, the desired constituents inside the bump after fusing the original bump and the solder material together are obtained by adjusting the ratio of constituents inside the solder material.

According to the first object of this invention, this invention provides a bump fabrication process. First, a wafer having an active surface is provided. A patterned solder mask layer is formed over the active surface of the wafer. The solder mask layer has a plurality of openings that exposes various bonding pads on the active surface of the wafer. A vertical section of each opening in the solder mask layer uncovers a profile with curvecurved sidelines. Thereafter, solder material is deposited into the opening and a reflow process is carried out so that the solder material melts into a spherical-shaped bump. Finally, the solder mask layer is removed.

According to the second object of this invention, this invention provides a bump fabrication process. First, a wafer having an active surface with bonding pads thereon is provided. A pre-formed solder bump is formed over each bonding pad on the active surface of the wafer. A patterned solder mask layer is formed over the wafer. The solder mask layer has a plurality of openings that exposes the respective bonding pads. The area of the opening in a cross-sectional area through the upper and lower surface of the solder mask layer is smaller than the area of the opening in a cross-sectional area through the mid-portion of the solder mask layer. In other words, a vertical section of each opening in the solder mask layer uncovers a profile with curvecurved sidelines. Solder material is deposited into the openings so that the solder material stacks on top of the pre-formed solder bump. Thereafter, a reflow process is conducted so that the solder material inside the opening and the pre-formed solder bump fuse to form a spherical bump. Finally, the solder mask layer is removed.

According to the third object of this invention, this invention provides a bump fabrication process. First, a wafer having an active surface with bonding pads thereon and each bonding pad having an overlying first bump is provided. A patterned solder mask layer is formed over the wafer. The solder mask layer has a plurality of openings that exposes the respective bonding pads on the active surface of the wafer. The area of the opening in a cross-sectional area through the upper and lower surfaces of the solder mask layer is smaller than the area of the opening in a cross-sectional area through the mid-portion of the solder mask layer. In other words, a vertical section through each opening in the solder mask layer uncovers a profile with curve-curved sidelines. Solder material is deposited into the openings so that the solder material stacks on top of the first solder bump. Thereafter, a reflow process is conducted so that the solder material inside the opening and the first solder bump fuse to form a second bump. Finally, the solder mask layer is removed.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
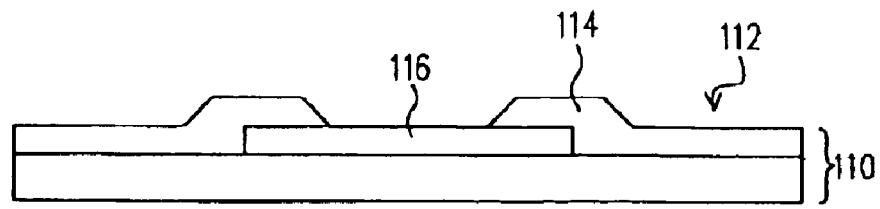
FIGS. 1A to 1F are schematic cross-sectional views showing the progression of steps for forming a conventional solder bump.
Figure 1B:
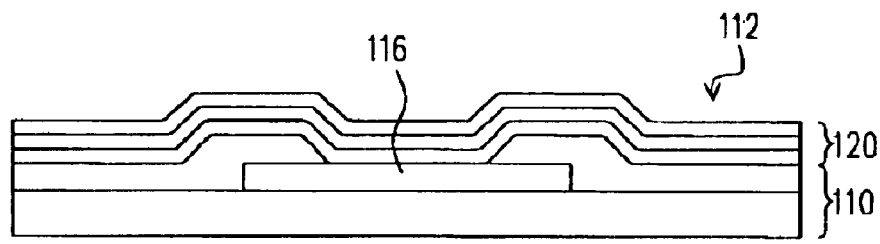
Figure 1C:
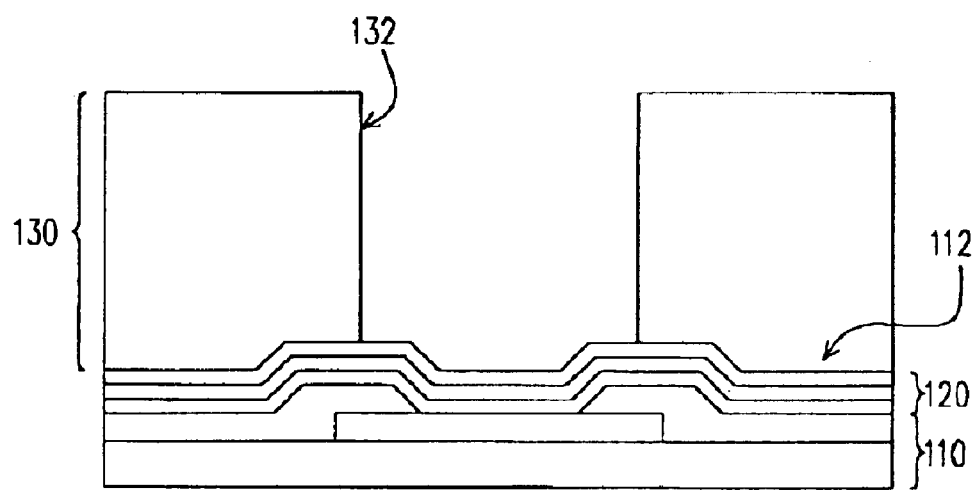
Figure 1D:
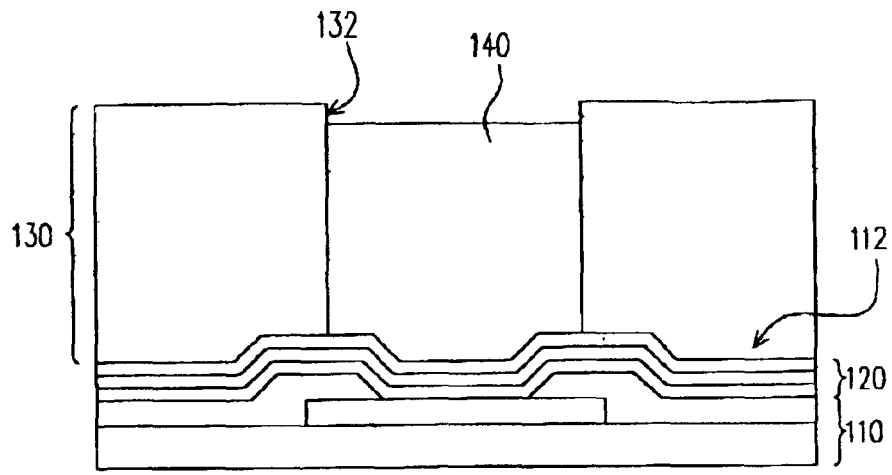
Figure 1E:
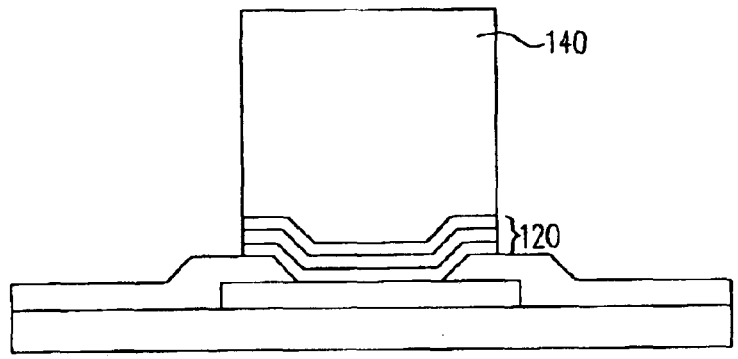
Figure 1F:
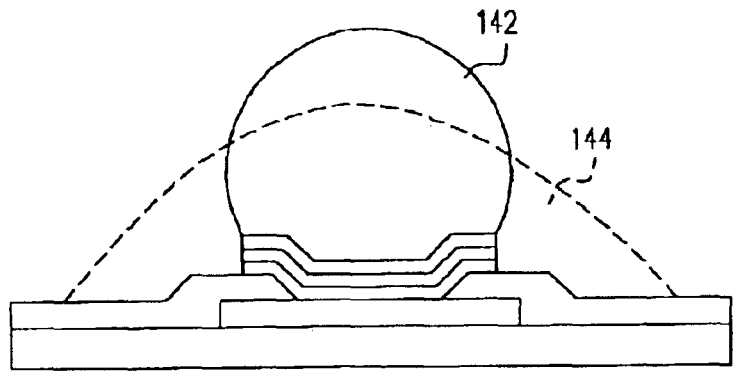

Reference will now be made in detail to the present preferred embodiments of the invention, examples of which are illustrated in the accompanying drawings. Wherever possible, the same reference numbers are used in the drawings and the description to refer to the same or like parts.

Figure 2A:
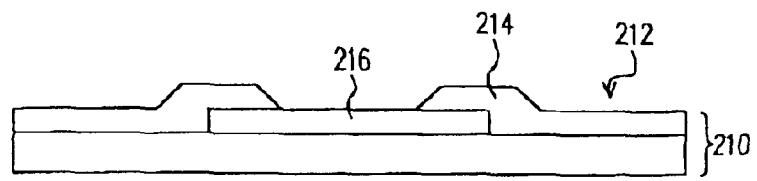
FIGS. 2A to 2F are schematic cross-sectional views showing the steps carried out in a bump fabrication process according to a the first preferred embodiment of this invention.

FIGS. 2A to 2F are schematic cross-sectional views showing the steps carried out in a bump fabrication process according to a the first preferred embodiment of this invention. As shown in FIG. 2A, a wafer 210 having an active surface 212 with a passivation layer 214 and a plurality of bonding pads 216 (only one is shown) is provided. The passivation layer 214 exposes the bonding pad 216 on the active surface 212 of the wafer 210.

Figure 2B:
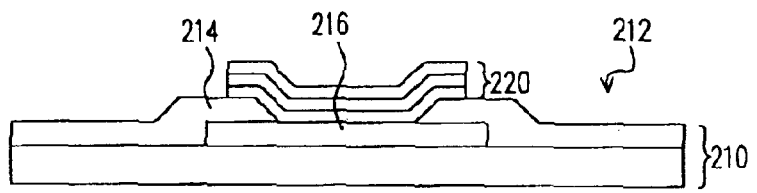

As shown in FIG. 2B, an under-ball-metallurgy (UBM) layer 220 is formed over each bonding pad 216. The under-ball-metallurgy layer 220 is fabricated by forming an under-ball-metallurgy layer 220 over the active surface 212 of the wafer 210 globally and then patterning the under-ball-metallurgy layer 220. In general, the under-ball-metallurgy layer 220 is a composite layer comprising a plurality of metallic layers each fabricated from a different material. The under-ball-metallurgy layer 220 is formed on the bonding pad 216 to increase the bonding strength with a subsequently formed bump 242.

Figure 2C:
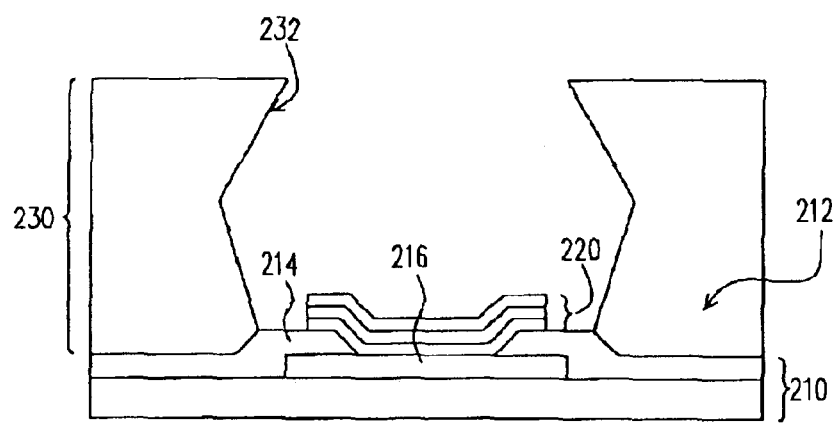
Figure 2D:
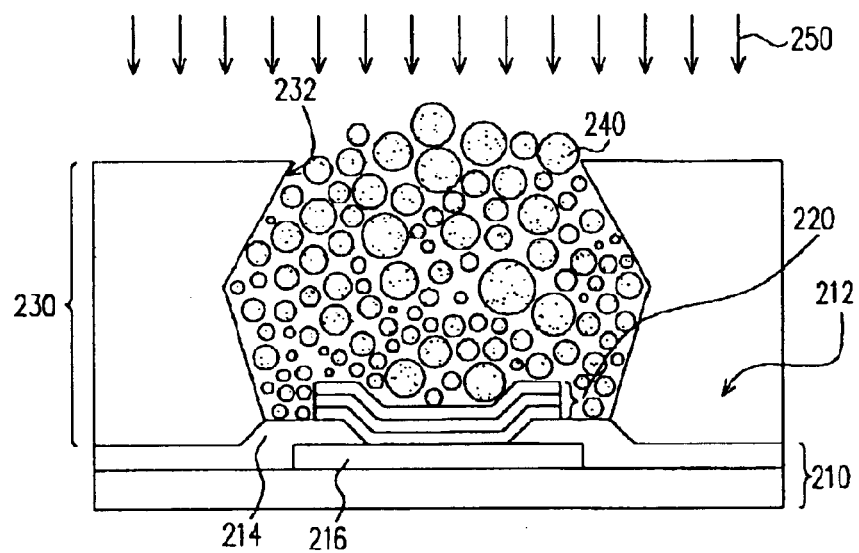

As shown in FIG. 2C, a patterned solder mask layer 230 is formed over the active surface 212 of the wafer 210. The solder mask layer 230 has a plurality of openings 232 (only one opening is shown) for exposing the under-ball-metallurgy layer 220. Note that the area of the opening in a cross-sectional area through the upper and lower end of solder mask layer 230 is smaller than the area of the opening in a cross-sectional area through mid-portion of the solder mask layer 230. In other words, the inner sidewalls of the opening 232 and the active surface 212 of the wafer 210 together form a cavity for accommodating solder material 240 as shown in FIG. 2D. The opening 232 is not limited to a circular shape. In fact, the opening 232 may have an octagonal or polygonal shape.

Figure 4A:
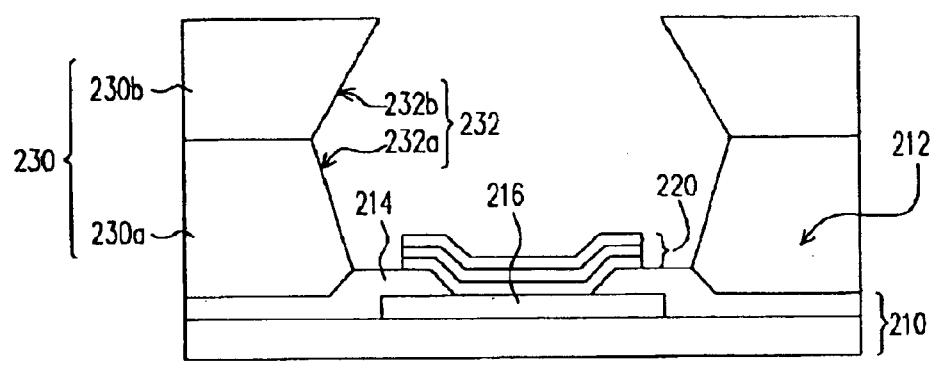
FIGS. 4A and 4B are cross-sectional views showing an identically laminated solder mask layer on two wafers each having a slightly different structural configuration.

Aside from using a stencil having a pre-formed opening 232 to serve as the solder mask layer 230 as shown in FIG. 2C, a lamination process can be used to form the solder mask layer 230. FIG. 4A is a cross-sectional view showing a laminated solder mask layer on a wafer. As shown in FIG. 4A, a patterned first photoresist photoresistant layer 230a is formed over the active surface 212 of the wafer 210. The first photoresist photoresistant layer 230a is fabricated using liquid photoresist photoresistant material or dry film. The first photoresist photoresistant layer 230a has a plurality of first openings 232a formed, for example, in a photo-via process. The area of the opening in a cross-sectional area through the lower surface of the first photoresist photoresistant layer 230a is smaller than the area of the opening in a cross-sectional area through the upper surface of the first photoresist photoresistant layer 230a.

Figure 5A:
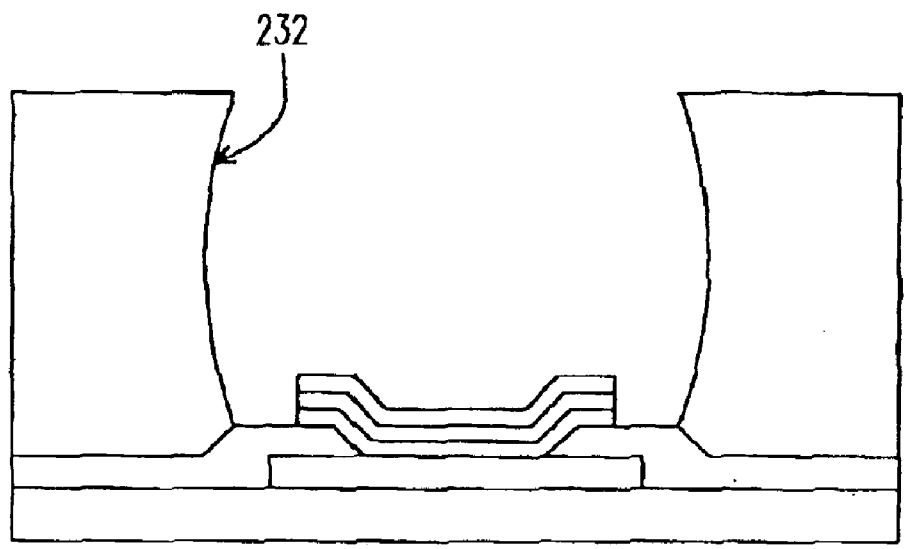
FIGS. 5A and 5B are cross-sectional views showing two possible types of profiles for the openings in a solder mask layer according to this invention.
Figure 5B:
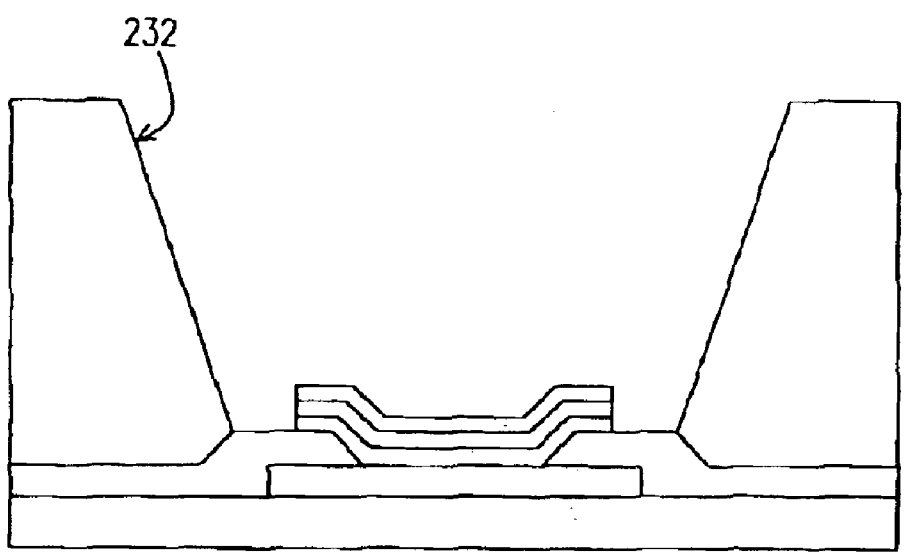

A second photoresist photoresistant layer 230b is attached to the upper surface of the first photoresist photoresistant layer 230a. The second photoresist photoresistant layer 230b also has a plurality of second openings 232b over the respective first openings 232a. The second photoresist photoresistant layer 230b is fabricated using a dry film, for example. The area of the opening in a cross-sectional area through the upper surface of the second photoresist photoresistant layer 230b is smaller than the area of the opening in a cross-sectional area through the lower surface of the second photoresist photoresistant layer 230b. The first photoresist photoresistant layer 230a and the second photoresist photoresistant layer 230b together form the solder mask layer 230 having a plurality of openings 232 therein. The opening 232 has a smaller cross-sectional area at the upper and lower surface of the solder mask layer 230 than a cross-sectional area through the mid-portion of the solder mask layer 230. In other words, a vertical section through the opening 232 of the solder mask layer 230 uncovers a profile resembling a pair of symmetrical outward-facing angular brackets. However, the sidewall profile of the opening in the solder mask layer need not be a pair of symmetrical angular brackets. Other sectional configurations of the opening such as a pair of arcs like the one in FIG. 5A or a pair of slant edges like the one in FIG. 5B are also permissible.

As shown in FIG. 2D, solder material 240 is deposited into the opening 232 using a printing process or some other method. The solder material 240 in powder or paste form is stacked over the bonding pad 216 inside the opening 232.

Figure 2E:
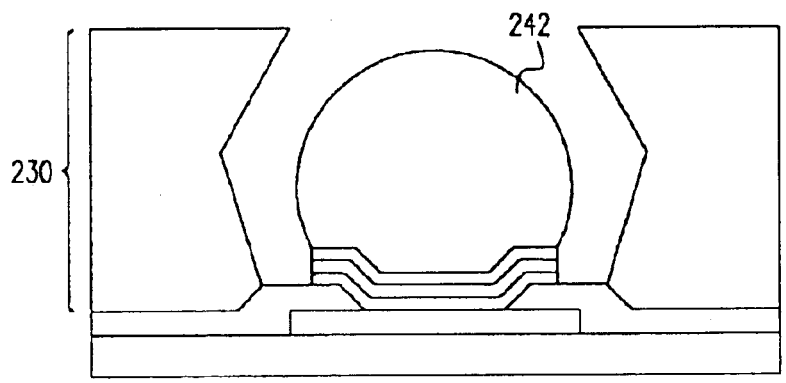
Figure 2F:
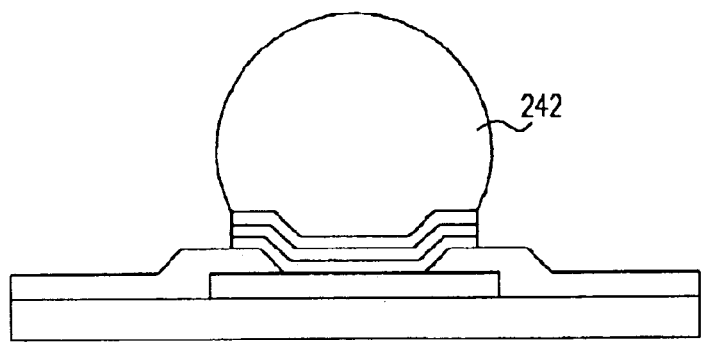

As shown in FIGS. 2D and 2E, flux 250 is sprayed over the solder material 240. When a reflow process is carried out, the flux 250 aids the fusion of solder material 240 into a bump 242. To obtain a perfectly spherical bump, a two-stage reflow process is often conducted. First, flux material 250 is mixed into the solder material 240 prior to depositing the solder material 240 into the openings 232. Thereafter, a first reflow process is carried out to fuse the solder material 240 into an initial bump 242. Subsequently, flux material 250 is sprayed over the initial bump 242 and a second reflow process is carried out to shape the initial bump 242 into a spherical structure. Finally, as shown in FIG. 2F, the solder mask layer 230 is removed to expose the bump 242 above the wafer 210.

In the first embodiment, a patterned solder mask layer is formed over the wafer. The solder mask layer has a plurality of openings. The opening in the solder mask layer has a barrel-like cavity so that the mid-portion of the opening is wider than both the upper and lower neck portion of the opening. Since the barrel-shaped opening provides a larger volume than a straight cylinder, more solder can be greatly accumulated inside the opening under the condition without changing the size of the cross-sectional bottom area of the opening. (in In other words, the size on the active area of the wafer being covered by the solder mask is not reduced). Consequently, size and height level of the bump can be increased.

Figure 3A:
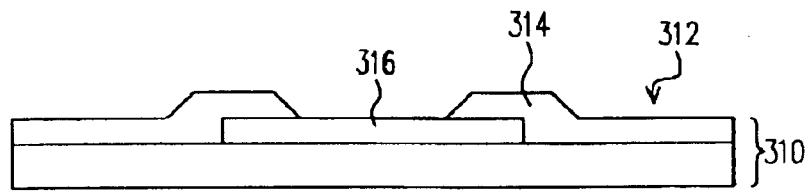
FIGS. 3A to 3F are schematic cross-sectional views showing the steps carried out in a bump fabrication process according to a the second preferred embodiment of this invention.

FIGS. 3A to 3F are schematic cross-sectional views showing the steps carried out in a bump fabrication process according to a the second preferred embodiment of this invention. As shown in FIG. 3A, a wafer 310 having an active surface 312 with a passivation layer 314 and a plurality of bonding pads 316 (only one is shown) is provided. The passivation layer 314 exposes the bonding pad 316 on the active surface 312 of the wafer 310.

Figure 3B:
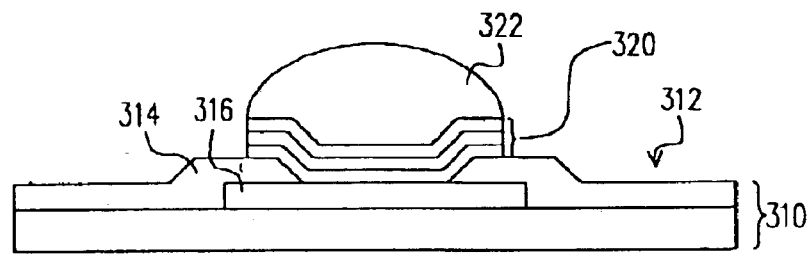

As shown in FIG. 3B, an under-ball-metallurgy (UBM) layer 320 is formed over each bonding pad 316. The under-ball-metallurgy layer 320 is fabricated by forming an under-ball-metallurgy layer 320 over the active surface 312 of the wafer 310 globally and then patterning the under-ball-metallurgy layer 320. A pre-formed bump 322 is formed over the bonding pad 316 (the under-ball-metallurgy layer 320). The purpose of having the pre-formed bump 322 is explained below.

Figure 3C:
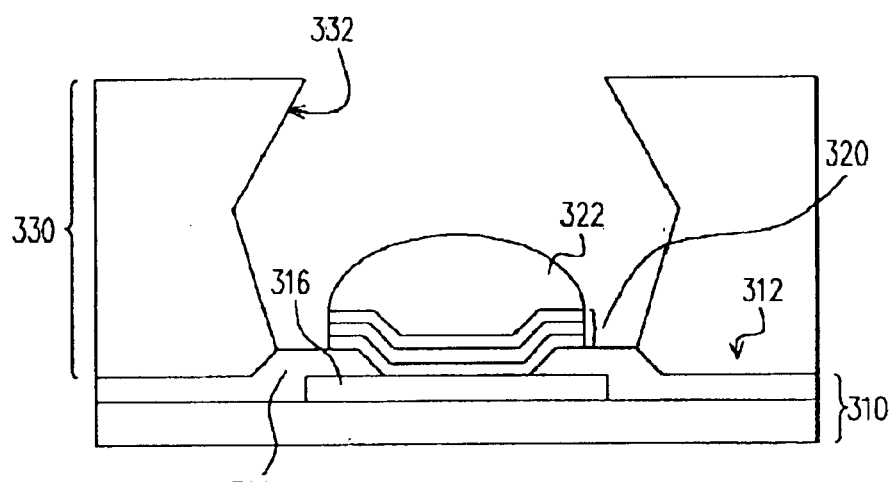
Figure 4B:
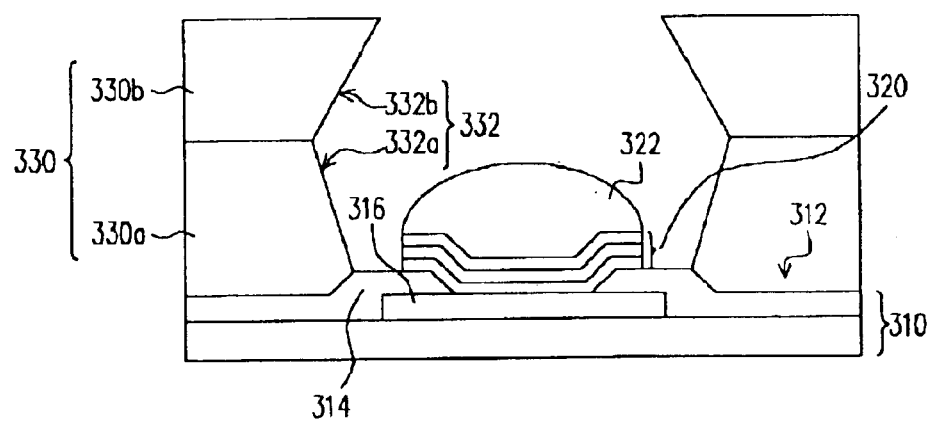

As shown in FIG. 3C, a solder mask layer 330 is formed over the active surface 312 of the wafer 310. The solder mask layer 330 has a plurality of openings 332 (only one is shown) that exposes the pre-formed bump 322 on the active surface 312 of the wafer 310. The solder mask layer 330 may comprise a first photoresist photoresistant layer 330a and a second photoresist photoresistant layer 330b as shown in FIG. 4B. A first opening 322a in the first photoresist photoresistant layer 330a and a second opening 332b in the second photoresist photoresistant layer 330b together form an opening 332 in the solder mask layer 330. A vertical section through the opening 332 has a pair of symmetrical outward-facing brackets profile or some other profile. The sidewall of the opening 332 together with the active surface 312 of the wafer 310 form a cavity for accommodating solder material.

Figure 3D:
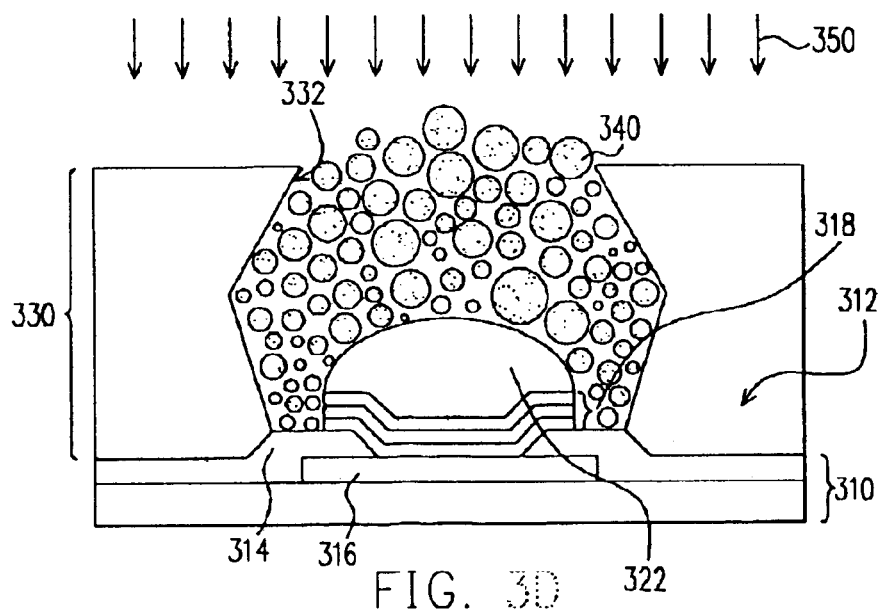

As shown in FIG. 3D, solder material 340 is deposited into the opening 332 using a printing process or some other method. The solder material 340 in powder or paste form is stacked over the pre-formed bump 322 inside the opening 332.

Figure 3E:
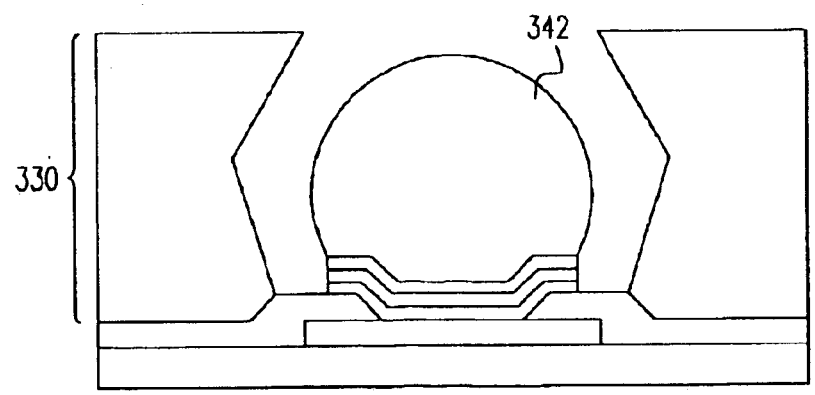
Figure 3F:
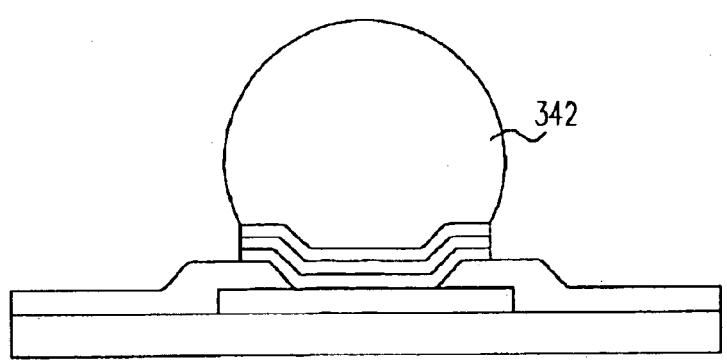

As shown in FIG. 3E, a reflow process is carried out so that the pre-formed bump 322 and the solder material 340 as shown in FIG. 3D are fused together to form a bump 342. Finally, as shown in FIG. 3F, the solder mask layer 330 is removed to expose the bump 342 above the wafer 310.

In the second embodiment, a patterned solder mask layer is formed over the wafer. The solder mask layer has a plurality of openings. The opening in the solder mask layer has a barrel-like cavity so that the mid-portion of the opening is wider than both the upper and lower neck portions of the opening. Since the barrel-shaped opening provides a larger volume than a straight cylinder, more solder can accumulate inside the opening. Consequently, size and height level of the bump can be increased. In addition, by adjusting the composition of constituents inside the preformed bump and the solder material, the desired bump composition can be obtained.

The third embodiment of this invention can be applied to vary the size and height level of a pre-formed bump on a wafer. Similar to the steps carried out in the first and the second embodiments, a solder mask layer with openings having curvecurved interior sidewalls is formed over the wafer such that the opening exposes the original pre-formed bump. Thereafter, solder material is deposited into the opening and allowed to stack on top of the pre-formed bump. A reflow process is conducted to fuse the solder material with the pre-formed bump and form a new bump having a larger size and a greater height. In addition, through a proper selection of the constituents inside the solder material, composition of the original pre-formed bump can be changed to a desirable composition in the newly formed bump.

The steps carried out for fabricating the bump in the third embodiment are similar to the later part of fabricating the bump in the second embodiment as shown in FIGS. 3B–3F. The only difference is that the pre-formed bump 322 should be renamed the first bump and the bump 342 should be renamed the second bump.

In summary, one major aspect of the bump fabrication process according to this invention is the formation of a patterned solder mask layer having openings therein over the wafer. The opening in the solder mask layer differs in the cross-sectional area between mid-section and the mouth-section of the opening. A vertical section through the opening in the solder mask layer has a profile resembling a pair of symmetrical curves, angle brackets, arcs or slant edges. All these openings form an interior cavity that can hold a larger volume of solder material under the condition without changing the size of the cross-sectional bottom area of the opening.(inIn other words, the size of the active area of the wafer being covered by the solder mask is not reduced). Consequently, size and height level of the bump can be increased.

Furthermore, the third embodiment of this invention also provides a process for forming a bump with lead solder material, lead-free solder material or some other material. Moreover, the composition of constituents inside the pre-formed bump and the solder material in the second embodiment or inside the first and second bump in the third embodiment can be tailored according to design to form a bump having the desired composition.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump fabrication process for forming a bump on a wafer having an active surface with a passivation layer and at least one bonding pad thereon such that the passivation layer exposes the bonding pad, the process comprising the steps of:

forming a patterned solder mask layer with a pattern over the active surface of the wafer, wherein the solder mask layer has at least one opening that exposes the bonding pad, and a cross-sectional area through a bottom-section of the opening is smaller than a cross-sectional area through a mid-section of the opening, while a cross-sectional area through a top-section of the opening is smaller than the cross-sectional area through the mid-section of the opening;

depositing a solder material into the opening;
conducting a reflow process so that the solder material inside the opening fuses together to form a bump; and
removing the solder mask layer.

2. The process of claim 1, wherein the bump is fabricated using leaded solder material or lead-free solder material.

3. The process of claim 1, wherein the step of forming the solder mask layer includes forming a first patterned photoresistant layer having at least one first opening therein such that the first opening exposes the bonding pad and that cross-sectional area through bottom-section of the first opening is smaller than cross-sectional area through a top-section of the first opening.

4. The process of claim 3, wherein the first patterned photoresistant layer is fabricated using liquid photoresist or dry film.

5. The process of claim 3, after the step of forming the first patterned photoresistant layer, further including forming a second patterned photoresistant layer over the first patterned photoresistant layer such that the second patterned photoresistant layer has at least a second opening that links up with the first opening and exposes the bonding pad and that cross-sectional area through bottom-section of the second opening is larger than cross-sectional area through top-section of the second opening.

6. The process of claim 5, wherein the second patterned photoresistant layer is fabricated using dry film.

7. The process of claim 1, wherein the solder material is in powder form or paste form.

8. The process of claim 1, wherein before the step of forming the solder mask layer, an under-ball-metallurgy layer is formed over the bonding pad so that the bump is disposed on the under-ball-metallurgy layer.

9. A bump fabrication process for forming a bump on a wafer having an active surface with a passivation layer and at least one bonding pad thereon such that the passivation layer exposes the bonding pad, the process comprising the steps of:
    forming a pre-formed bump over the bonding pad of the wafer;
    forming a patterned solder mask layer with a pattern over the active surface of the water, wherein the solder mask layer has at least one opening that exposes the pre-formed bump, and a cross-sectional area through a bottom-section of the opening is smaller than a cross-sectional area through a mid-section of the opening;
    depositing a solder material into the opening;
    conducting a reflow process so that the solder material inside the opening and the pre-formed bump fuse together to form a bump; and
    removing the solder mask layer.

10. The process of claim 9, wherein a cross-sectional area through a top-section of the opening is smaller than the cross-sectional area through the mid-section of the opening.

11. The process of claim 9, wherein the solder material is fabricated using constituents that differ from the constituents inside the pre-formed bump.

12. The process of claim 9, wherein the bump is fabricated using leaded solder material or lead-free solder material.

13. The process of claim 9, wherein the step of forming the solder mask layer includes forming a first patterned photoresistant layer having at least one first opening therein such that the opening exposes the pre-formed bump and that cross-sectional area through bottom-section of the first opening is smaller than a cross-sectional area through a top-section of the first opening.

14. The process of claim 13, wherein the first patterned photoresistant layer is fabricated using liquid photoresist or dry film.

15. The process claim 13, after the step of forming the first patterned photoresistant layer, further including forming a second patterned photoresistant layer over the first patterned photoresistant layer such that the second patterned photoresistant layer has at least a second opening that links up with the first opening and exposes the pre-formed bump and that cross-sectional area through bottom-section of the second opening is larger than a cross-sectional area through top-section of the second opening.

16. The process of claim 15, wherein the second patterned photoresistant layer is fabricated using dry film.

17. The process of claim 9, wherein the solder material is in powder form or paste form.

18. The process of claim 9, before the step of forming the solder mask layer, further including forming an under-ball-metallurgy layer over the bonding pad so that the bump is disposed on the under-ball-metallurgy layer.

19. A bump fabrication process for forming at least a second bump on a wafer having an active surface with at least a first bump thereon, the process comprising the steps of:
    forming a patterned solder mask layer with a pattern over the active surface of the wafer, wherein the solder mask layer has at least one opening that exposes the first bump, and a cross-sectional area through a bottom-section of the opening is smaller than a cross-sectional area through a mid-section of the opening;
    depositing a solder material into the opening;
    conducting a reflow process so that the solder material inside the opening and the first bump fuse together to form a second bump; and
    removing the solder mask layer.

20. The process of claim 19, wherein a cross-sectional area through a top-section of the opening is smaller than the cross-sectional area through the mid-section of the opening.

21. The process of claim 19, wherein the solder material is fabricated using constituents that differ from the constituents inside the first bump.

22. The process of claim 19, wherein the first and second bumps are fabricated using leaded solder material or lead-free solder material.

23. The process of claim 19, wherein the step of forming the solder mask layer includes forming a first patterned photoresistant layer having at least one first opening therein such that the opening exposes the first bump and that cross-sectional area through a bottom-section of the first opening is smaller than a cross-sectional area through the top-section of the first opening.

24. The process of claim 23, wherein the first patterned photoresistant layer is fabricated using liquid photoresist or dry film.

25. The process of claim 23, after the step of forming the first photoresistant layer, further including forming a second patterned photoresistant layer over the first patterned photoresistant layer such that the second patterned photoresistant layer has at least a second opening that links up with the first opening and exposes the first bump and that cross-sectional area through bottom-section of the second opening is larger than cross-sectional area through ac top-section of the second opening.

26. The process of claim 25, wherein the second patterned photoresistant layer is fabricated using dry film.

27. The process of claim 19, wherein the solder material is in powder form or paste form.

* * * * *